United States Patent
Park et al.

(10) Patent No.: US 8,130,011 B2
(45) Date of Patent: Mar. 6, 2012

(54) POWER IC AND DRIVING METHOD THEREOF

(75) Inventors: Sung-Min Park, Gangnam-gu (KR); Seok-Hoon Bang, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/627,952

(22) Filed: Nov. 30, 2009

(65) Prior Publication Data
US 2010/0134150 A1 Jun. 3, 2010

(30) Foreign Application Priority Data
Dec. 3, 2008 (KR) .................. 10-2008-0121891

(51) Int. Cl.
*H03K 5/22* (2006.01)
*H03K 5/153* (2006.01)
(52) U.S. Cl. .................. 327/89; 327/74; 327/77
(58) Field of Classification Search .............. 327/74, 327/77, 89
See application file for complete search history.

(56) References Cited

U.S. PATENT DOCUMENTS
6,998,899 B2 * 2/2006 Nadd et al. .................. 327/513
* cited by examiner

*Primary Examiner* — Lincoln Donovan
*Assistant Examiner* — John Poos
(74) *Attorney, Agent, or Firm* — Sherr & Vaughn, PLLC

(57) ABSTRACT

A power integration circuit includes: a first transistor having a control electrode connected to a first voltage source to be supplied with a control signal therefrom, the first transistor being connected between a switch and a ground. A sense resistor has one end connected to the ground. A second transistor has a control electrode connected to the first voltage source to be applied with a control signal therefrom, with the second transistor being connected between the switch and the other end of the sense resistor. The power integration circuit further includes: a comparator for comparing the sense voltage with the reference voltage and delivering a difference between the sense voltage and the reference voltage to a logic circuit.

16 Claims, 3 Drawing Sheets

POWER IC AND DRIVING METHOD THEREOF

The present application claims priority under 35 U.S.C. 119 to Korean Patent Application No. 10-2008-0121891 (filed on Dec. 3, 2008), which is hereby incorporated by reference in its entirety.

BACKGROUND

A power IC such as a linear/switching regulator includes a sensing block which is connected to a feedback loop for control of circuit operation and sensing an output voltage. The sensing block determines whether or not the sensed output voltage corresponds to a desired voltage value, and then adjusts the output voltage through a logic circuit.

FIG. 1 is a circuit diagram of a related power IC including such a sensing block. As shown in FIG. 1, the related power IC connects an M:1 matched power transistor Tp and a sense transistor Ts to a common control signal line. In addition, the power transistor Tp is connected between a switch and a power ground, and the sense transistor Tp is also connected between the switch and the power ground via a sense resistor Rs. Accordingly, when current is applied to the power IC via the switch, sensing current corresponding to 1/M of power current Io flowing through the voltage transistor Tp flows through the sense resistor Rs according to a transistor matching ratio (M), and a voltage across the sense resistor Rs is applied as a sense voltage to a comparator Comp.

In addition, the comparator Comp is applied, as a reference voltage $V_{REF}$, with a voltage from a reference voltage source $V_{BG}$ divided by a first resistor R1 and a second resistor R2 connected between the reference voltage source $V_{BG}$ and an analog ground. The power IC may be designed to separate the power ground from the analog ground to prevent power elements connected to the power ground from affecting analog elements connected to the analog ground.

Accordingly, the comparator Comp compares the sense voltage with the reference voltage and applies a result of the comparison to a logic circuit connected to an output port, and the logic circuit changes a final output of the power IC using the applied result.

The comparator can sense and change an output at a point of time when a voltage RsIo/M across the sense resistor Rs becomes equal to the reference voltage $V_{REF}$. Accordingly, the maximum of current Io which can be sensed by the comparator Comp is determined by the following equation.

$$I_O = \frac{M}{R_S} V_{REF} \quad \text{[Equation 1]}$$

As shown in FIG. 2, however, an unintended parasitic resistive component Rp exists in an actual power ground. Such a parasitic resistance Rp is generated by various factors such as a ground pattern, a pad, a bonding, a metal pattern and the like. Accordingly, it is difficult to predict a value of the parasitic resistance Rp which is generated during a process.

FIG. 2 shows an effect of such parasitic resistance Rp on the power IC. Power current Io passing through the power transistor Tp and sense current Io/M passing through the sense transistor Ts pass through the parasitic resistance Rp. Accordingly, since a voltage is applied across the sense resistance Rs, a sense voltage applied to the comparator Comp is determined by the following equation.

$$V_S = \frac{I_o}{M} R_S + \frac{(M+1)}{M} I_o R_p \quad \text{[Equation 2]}$$

This equation can be rearranged as the following equation.

$$I_O = \frac{M}{R_S + (M+1)R_p} V_S \quad \text{[Equation 3]}$$

In comparison with Equation 1, a term '(M+1)Rp' is added to the denominator of Equation 3, and accordingly sensible current Io becomes small due to the parasitic resistance Rp in an actual circuit. Since a matching ratio (M) is typically more than 100, this has an effect on the sense current Io even if the parasitic resistance Rp has a small value. As a result, a difference between actual sense current and sense current calculated in design is generated due to the parasitic resistance Rp, which may result in low reliability of circuit operation.

SUMMARY

Embodiments relate to a power IC (Integration Circuit) and a driving method thereof, and more particularly, to a power IC a driving method thereof capable of minimizing an error of sense current, thereby improving sensing accuracy, stability and reliability of circuit operation, and a yield, and a driving method thereof. In view of the above, embodiments provide a power IC capable of minimizing an error of sensing current and a driving method thereof, thereby improving sensing accuracy for an output voltage, stability and reliability of operation, and a yield.

In accordance with embodiments, there a power IC may include: a first transistor having a control electrode connected to a first voltage source carrying a control signal, the first transistor being connected between a switch and a ground; a sense resistor having a first end and a second end, with the first end connected to the ground; a second transistor having a control electrode connected to the first voltage source carrying the control signal, the second transistor being connected between the switch and the second end of the sense resistor; and a comparator electrically connected to the second end of the sense resistor, thereby receiving a sense voltage at a first input, and receiving at a second input a reference voltage supplied from voltage dividing resistors connected between a second voltage source and the ground, for comparing the sense voltage with the reference voltage and outputting a difference between the sense voltage and the reference voltage to a logic circuit.

The ground may be a power ground.

The first transistor and the second transistor may be formed to have a preset matching ratio (M), and current flowing through the first transistor may be equal to the matching ratio (M) multiplied by the current flowing the second transistor.

The voltage dividing resistors may include: a first voltage dividing resistor connected between the second voltage source and the second input terminal of the comparator; and a second voltage dividing resistor connected between the second input terminal of the comparator and the ground.

The comparator may be an operational amplifier.

In accordance with another aspect of embodiments, there is provided: a driving method of a power IC including: controlling the on-state of a first transistor and a second transistor by a control signal from a first voltage source; supplying a first current from a switch to be branched into the first transistor and the second transistor and flow into a ground; supplying a sense voltage which is a potential difference between the ground and a sense resistor connected between the second transistor and the ground to a first comparator input; supplying a second current flowing from a second voltage source through a first voltage dividing resistor and a second voltage dividing resistor into the ground; supplying a reference voltage, formed by the second current flowing between second voltage dividing resistor and the ground, to the comparator; and comparing the sense voltage with the reference voltage to output a result of the comparison to a logic circuit from the comparator.

The ground in said applying a first current and applying second current may be a power ground. In said applying first current, current may flow the first transistor with matching ratio (M) times as large as current of the second transistor. In said comparing the sense voltage, the comparator may amplify a difference between the sense voltage and the reference voltage and apply the amplified difference to the logic circuit.

As described above, the power IC of embodiments uses an existing power ground as a ground of the comparator, thereby reducing an effect of parasitic resistance appearing on the power ground on sense current, which results in improved stability and reliability of overall operational characteristics and hence an increased yield of the power IC.

DRAWINGS

Figure 1:
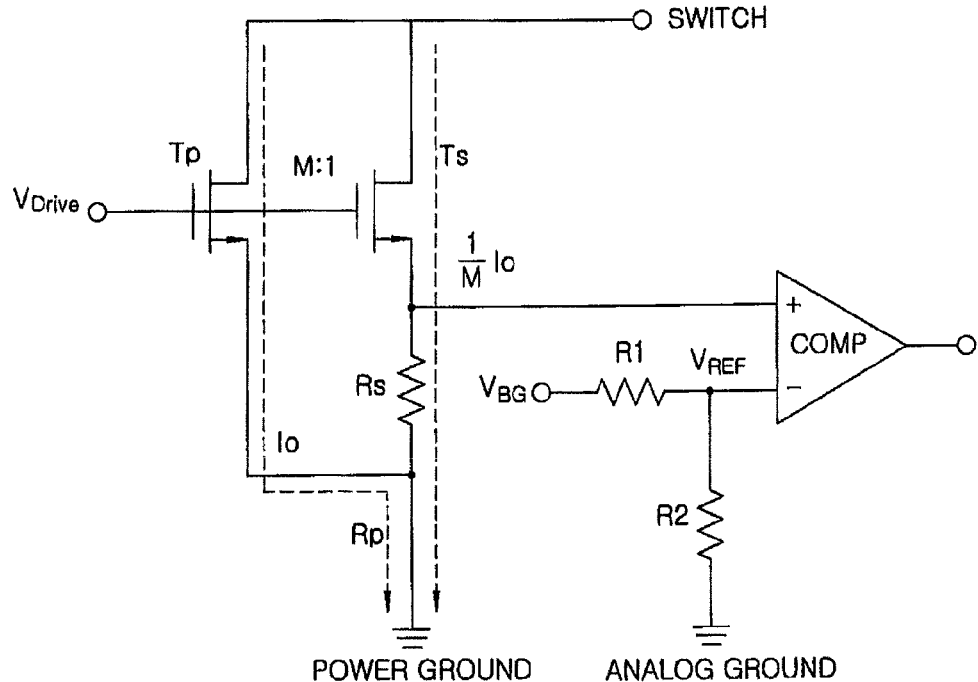
FIG. 1 is a circuit diagram of a related power IC.
Figure 2:
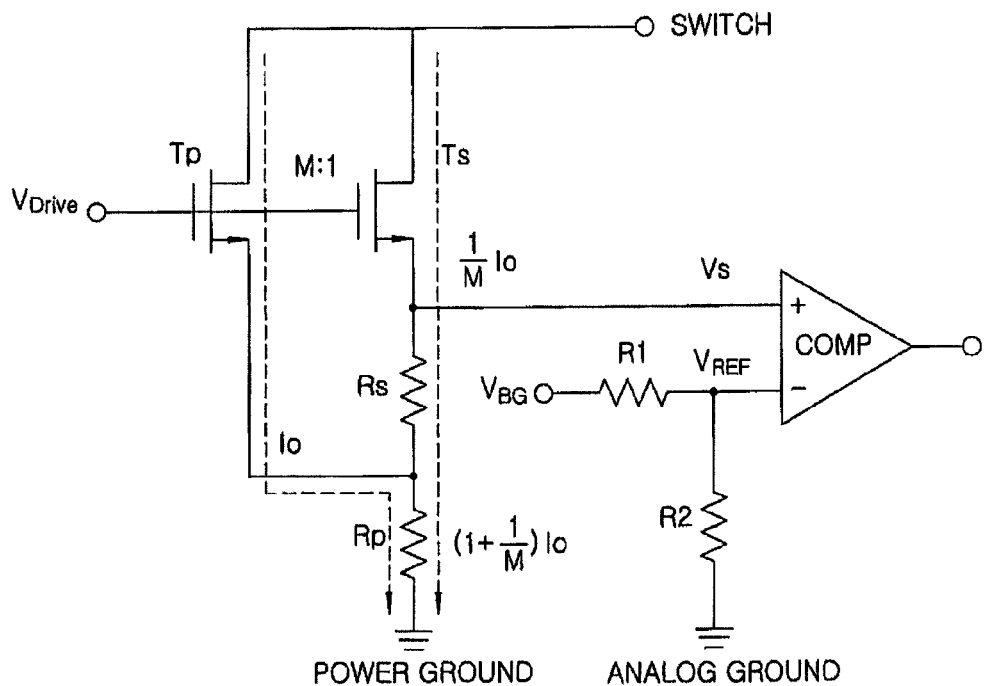
FIG. 2 is a circuit diagram showing a model of parasitic resistive component in the related power IC.
Figure 3:
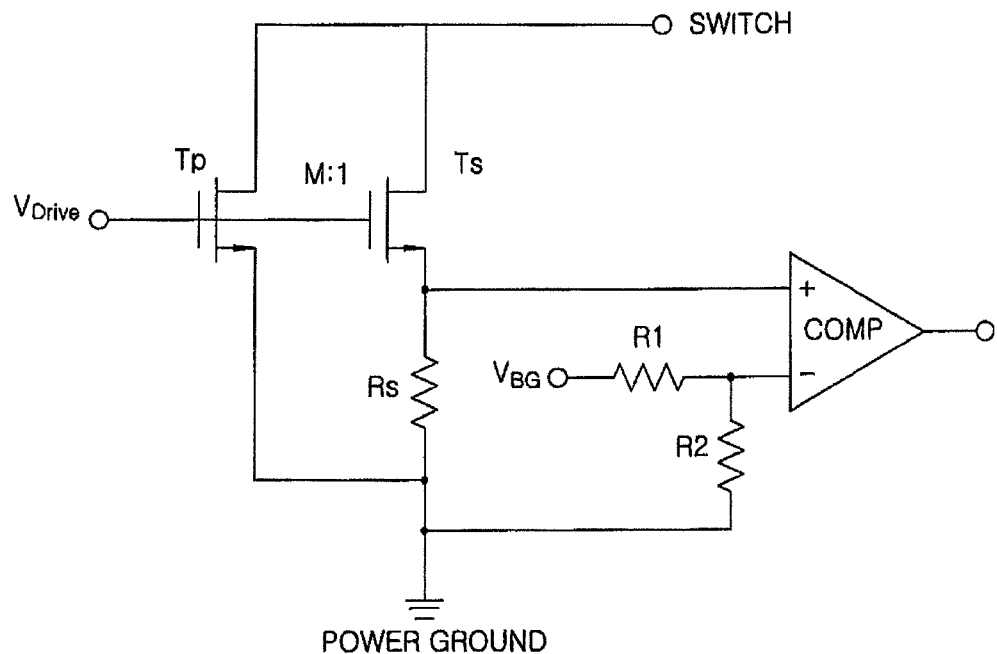

Example FIG. 3 is a circuit diagram of a power IC in accordance with embodiments.

Figure 4:
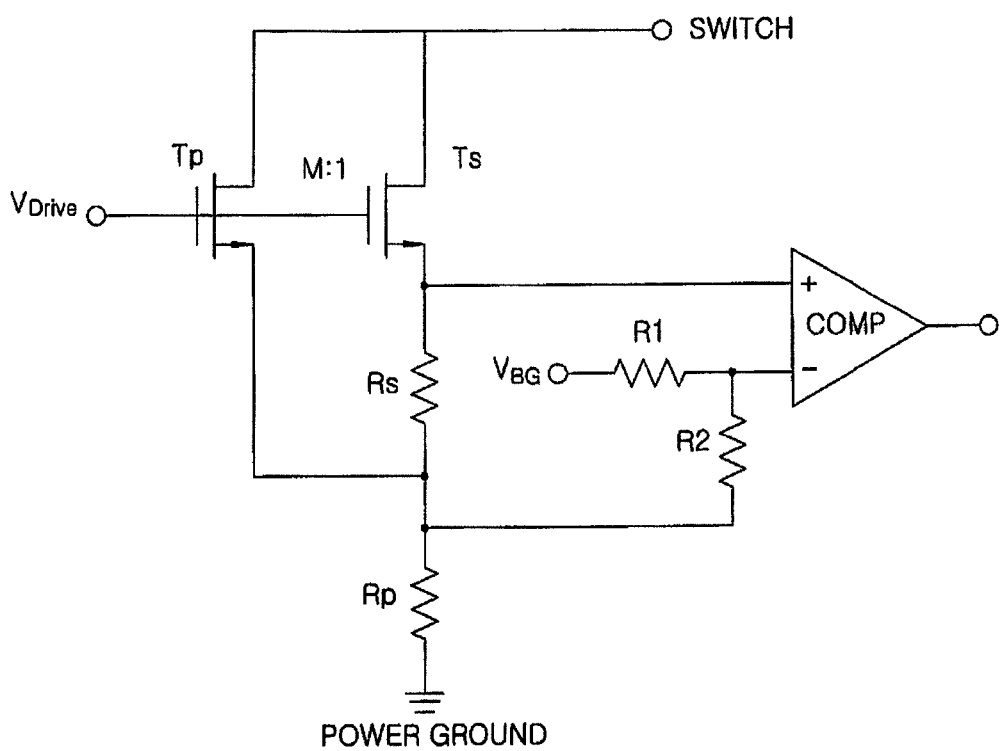

Example FIG. 4 is a circuit diagram showing a model of parasitic resistive component in the power IC in accordance with embodiments.

Figure 5:
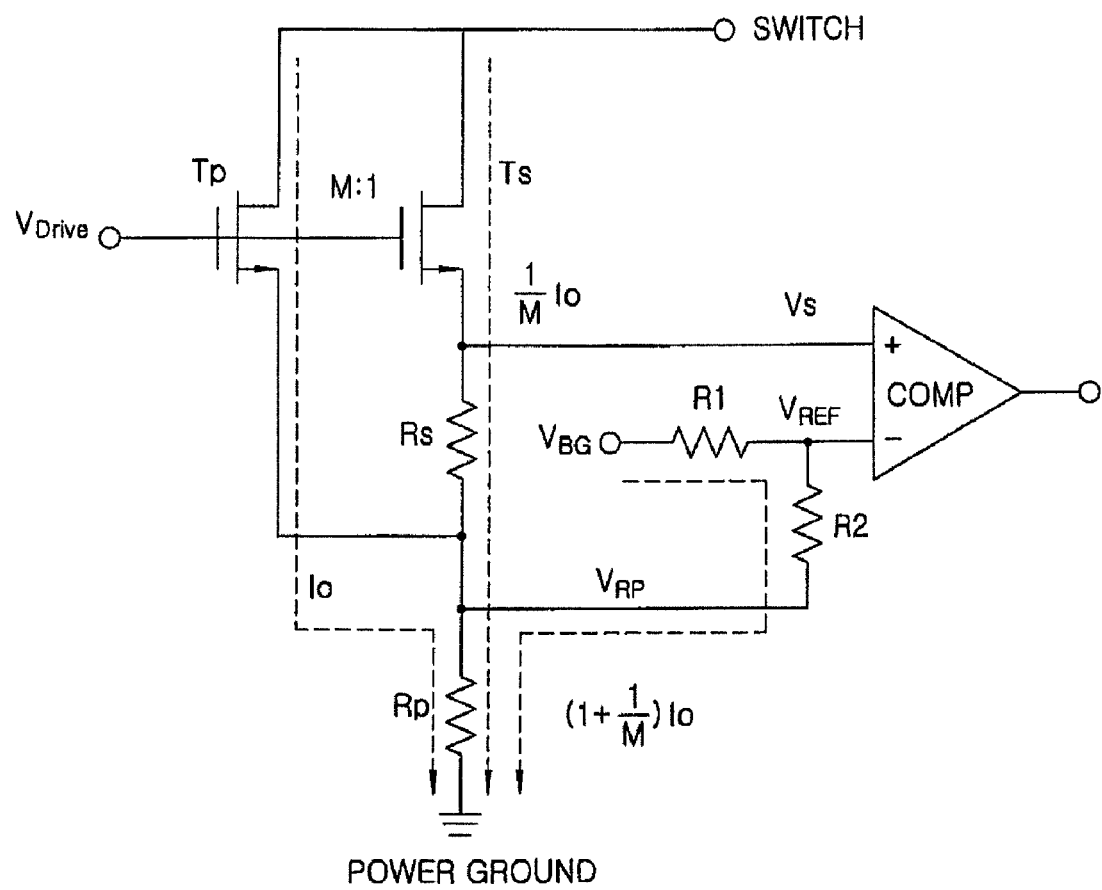

Example FIG. 5 is a circuit diagram showing a flow of current in the power IC in accordance with embodiments.

DESCRIPTION

A configuration of a power IC in accordance with embodiments will be now described. Example FIG. 3 is a circuit diagram of a power IC in accordance with embodiments. Referring to example FIG. 3, a power IC in accordance with embodiments may include a power transistor Tp, a sense transistor Ts, a sense resistor Rs, a comparator Comp, a first voltage dividing resistor R1 and a second voltage dividing resistor R2.

A control electrode of the power transistor Tp may be connected to a first power source $V_{Drive}$. The power transistor Tp may be formed between a switch and a power ground. The power transistor Tp may be supplied with power current Io by a supply voltage supplied through the switch. When the power transistor Tp is turned on by the first power source $V_{Drive}$, it conducts the power current in accordance with a power voltage from the switch.

A control electrode of the sense transistor Ts may be connected to the first power source $V_{Drive}$. In addition, the sense transistor Ts may be electrically connected in series to the sense resistor Rs between the switch and the power ground. The sense transistor Ts may be matched with the power transistor Tp with an M:1 ratio. Accordingly, when a control signal is applied by first power source $V_{Drive}$ to turn on the power transistor Tp and the sense transistor Ts together, the magnitude of a sense current applied to the sense transistor Ts becomes 1/M of the power current Io applied to the power transistor Tp.

The sense resistor Rs may be connected in series to the sense transistor Ts between the switch and the power ground. Accordingly, a sense voltage is developed across the sense resistor Rs by the sense current Io/M, and is input to a first input terminal of the comparator Comp.

The first voltage dividing resistor R1 and the second voltage dividing resistor R2 may be respectively connected to a second voltage source $V_{BG}$ and the power ground. The first voltage dividing resistor R1 may be connected between the second voltage source $V_{BG}$ and a second input terminal of the comparator Comp, and the second voltage dividing resistor R2 may be connected between the second input terminal of the comparator Comp and the power ground. If the comparator Comp is an operational amplifier, since little current is input to the input terminal, current from the second voltage source $V_{BG}$ flows through the first voltage dividing resistor R1 and the second voltage dividing resistor R2 into the power ground. Accordingly, a voltage divided by the first voltage dividing resistor R1 and the second voltage dividing resistor R2 is applied as a reference voltage to the second input terminal of the comparator Comp.

The comparator Comp is supplied with the sense voltage and the reference voltage and applies an output signal to a logic circuit. The comparator Comp can generate the output signal by amplifying a difference between the sense voltage and the reference voltage. To this end, the comparator Comp may be implemented by an operational amplifier (OP-AMP). If the sense voltage is less than the reference voltage, the comparator Comp generates a negative output signal and the logic circuit keeps the power transistor Tp turned on. On the other hand, if the sense voltage is larger than the reference voltage, the comparator Comp generates a positive output signal and the logic circuit keeps the power transistor Tp turned off, thereby controlling overall supply of power.

Hereinafter, an actual circuit design of the power IC in accordance with embodiments will be described. Example FIG. 4 is a circuit diagram showing a parasitic resistive component modeled as a resistor Rp in the power IC in accordance with embodiments. As shown in example FIG. 4, an actual circuit of the power IC in accordance with embodiments includes parasitic resistance Rp modeled between a sense resistor Rs and a power ground.

The parasitic resistor Rp is a model of an undesired resistive component caused by various factors such as resistance appearing on a pattern of the power ground, a pad, bonding resistance and the like. The parasitic resistance Rp may generate an error in the power current Io which can be sensed as described above, which may cause problems such as disturbance of normal circuit operation. However, since the parasitic resistance Rp is not considered in design and is varied depending on actual circuit implementation, different power ICs may have different resistance values. That is, it is difficult to predict a resistance value in design.

As will be described below, the power IC according to embodiments can improve stability and reliability of operation by reducing an effect of the parasitic resistance Rp on the sensible current Io. Hereinafter, a driving method and operation of the power IC in accordance with embodiments will be described.

Example FIG. 5 shows a flow of current in the power IC for the purpose of explaining an operation of the power IC in accordance with embodiments. In a driving method of the power IC with reference to example FIG. 5, the power transistor Tp and the sense transistor Ts may be first supplied with a turn-on control signal from the first voltage source $V_{Drive}$. When the power transistor Tp and the sense transistor Ts are turned on, sense current (Io/M), which is 1/M of the power current Io flowing through the power transistor Tp, flows into the sense transistor Ts. At this time, the sense current (Io/M) flowing into the sense transistor Ts also flows into the sense resistor Rs.

In addition, as a voltage may be applied from the second voltage source $V_{BG}$, reference current flows through the first voltage dividing resistor R1, the second voltage dividing resistor R2 and the parasitic resistance Rp into the power ground. At this time, the current flowing through the parasitic resistance may include the power current to flowing through the power transistor Tp, the sense current Io/M flowing through the sense transistor Tp, and reference current applied from the second voltage source $V_{BG}$. However, the reference current applied from the second voltage source $V_{BG}$ may be measured in very small units, micromilliamps [μmA], so that it is extremely small compared to the power current Io and the sense current Io/M which may be measured in milliamps [ma]. Accordingly, the current flowing through the parasitic resistance Rp can be approximated to Io+Io/M. As a result, a voltage across the parasitic resistance Rp can be formulated by the following equation.

$$V_{RP} = \frac{(M+1)}{M} I_O R_P \quad \text{[Equation 4]}$$

In addition, a sense voltage Vs' applied to the first input terminal of the comparator Comp can be calculated from the following equation.

$$V'_S = V_{RP} + \frac{I_O}{M} R_S \quad \text{[Equation 5]}$$

Further, a reference voltage VREF' applied to the second input terminal of the comparator Comp can be calculated from the following equation.

$$V'_{REF} = V_{RP} + \frac{R_2}{R_1 + R_2}(V_{BG} - V_{RP}) \quad \text{[Equation 6]}$$

Equations 4 to 6 to calculate the sense current Io under the condition of Vs'=VREF', which is the basis of operation control, are combined into the following equation.

$$\frac{I_O}{M} R_S = \frac{R_2}{R_1 + R_2} V_{BG} - \left(\frac{R_2}{R_1 + R_2}\right)\left(\frac{M+1}{M}\right) I_O R_P \quad \text{[Equation 7]}$$

Again, Io is rearranged as the following equation.

$$I_O = \frac{M}{R_S + \left(\frac{R_2}{R_1 + R_2}\right)(M+1)R_P} \quad \text{[Equation 8]}$$

From comparison of Equation 3 calculated based on the related power IC with Equation 8 calculated based on the power IC of embodiments, it can be seen that a coefficient of the parasitic resistance Rp in Equation 8 is changed to R2 (M+1)/(R1+R2), while a coefficient of Rp in Equation 3 is M+1. In other words, it can be confirmed that an effect by the parasitic resistance Rp is reduced by R2/(R1+R2) in the power IC of embodiments as compared to the convention power IC.

As a result, since the power IC of embodiments reduces an effect by the parasitic resistance Rp to R2/(R1+R2) times, it is possible to improve stability and reliability of overall operation characteristics. In addition, this also can increase a yield of the power IC.

Hereinafter, an improved effect of the power IC of embodiments will be described with an application of voltages and resistances actually used in the power IC. For example, it may be assumed that a voltage of the second voltage source $V_{BG}$, is 1V, a ratio of the first voltage dividing resistance R1 to the second voltage dividing resistance R2 is 9:1, and resistance of the sense resistor RS is 10Ω. In this case, an ideal value of the sense current Io becomes 1 A according to Equation 1.

As an example, if actual parasitic resistance Rp is 10 mΩ, the sense current Io in the related power IC becomes 0.908 A according to Equation 3, that is, has a difference of 9.2% from the ideal value. On the other hand, the sense current Io in the power IC of embodiments becomes 0.992 A according to Equation 8, that is, has only a difference of 0.8% from the ideal value.

From comparison of the above results, it can be confirmed that the power IC of embodiments is further improved to have a difference of 0.8% of the sense current with respect to the ideal value as compared to a difference of 9.2% of the sense current in the related power IC. Accordingly, the power IC of embodiments can have higher reliability and stability of operation than the related power IC, and accordingly provide a corresponding operation margin to improve yield.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a first transistor having a control electrode connected to a first voltage source carrying a control signal, the first transistor being connected between a switch and a ground;
   a sense resistor having a first end and a second end, with the first end connected to the ground;
   a second transistor having a control electrode connected to the first voltage source carrying the control signal, the second transistor being connected between the switch and the second end of the sense resistor; and
   a comparator electrically connected to the second end of the sense resistor, thereby receiving a sense voltage at a first input, and receiving at a second input a reference voltage supplied from voltage dividing resistors connected between a second voltage source and the ground, for comparing the sense voltage with the reference voltage and outputting a difference between the sense voltage and the reference voltage to a logic circuit,
   wherein the voltage dividing resistors include:
   a first voltage dividing resistor connected between the second voltage source and the second input terminal of the comparator; and
   a second voltage dividing resistor connected between the second input terminal of the comparator and the ground,
   wherein the connections to ground include a parasitic resistance.

2. The apparatus of claim 1, wherein the ground is a power ground.

3. The apparatus of claim 1, wherein the first transistor and the second transistor are formed to have a preset matching ratio (M), and current flowing through the first transistor is equal to the matching ratio (M) multiplied by the current flowing the second transistor.

4. The apparatus of claim 1, wherein the comparator is an operational amplifier.

5. The apparatus of claim 1, wherein the connection of the second voltage dividing resistor is connected to the ground through substantially the same parasitic resistance as the connection to the ground of the first transistor.

6. The apparatus of claim 5, wherein the connection of the second voltage dividing resistor is connected to the ground through substantially the same parasitic resistance as the connection to the ground of the second transistor.

7. A method comprising:
controlling the on-state of a first transistor and a second transistor by a control signal from a first voltage source;
supplying a first current from a switch to be branched into the first transistor and the second transistor and flow into a ground;
supplying a sense voltage which is a potential difference between the ground and a sense resistor connected between the second transistor and the ground to a first comparator input;
supplying a second current flowing from a second voltage source through a first voltage dividing resistor and a second voltage dividing resistor into the ground;
supplying a reference voltage, formed by the second current flowing between second voltage dividing resistor and the ground, to the comparator; and
comparing the sense voltage with the reference voltage to output a result of the comparison to a logic circuit from the comparator,
wherein the ground in said supplying a first current and supplying second current is a power ground,
wherein the power ground includes a parasitic resistance.

8. The method of claim 7, wherein, in said supplying the first current, current flows through the first transistor with matching ratio (M) times as large as the current through the second transistor.

9. The method of claim 7, wherein in said comparing the sense voltage, the comparator amplifies a difference between the sense voltage and the reference voltage and outputs the amplified difference to the logic circuit.

10. The method of claim 7, including connecting the second voltage dividing resistor to the power ground, and connecting the first transistor to the power ground both include connecting to the power ground through substantially the same parasitic resistance.

11. The method of claim 10, including connecting the second voltage dividing resistor to the power ground, and connecting the second transistor to the power ground both include connecting to the power ground through substantially the same parasitic resistance.

12. A method comprising:
controlling the on-state of a first transistor and a second transistor by a control signal from a first voltage source;
supplying a first current from a switch to be branched into the first transistor and the second transistor and flow into a ground through a parasitic resistance;
supplying a sense voltage which is a potential difference between the ground and a sense resistor connected between the second transistor and the ground through the parasitic resistance to a first comparator input;
supplying a second current flowing from a second voltage source through a first voltage dividing resistor and a second voltage dividing resistor into the ground through the parasitic resistance;
supplying a reference voltage, formed by the second current flowing between second voltage dividing resistor and the ground through the parasitic resistance, to the comparator; and
comparing the sense voltage with the reference voltage to output a result of the comparison to a logic circuit from the comparator.

13. The method of claim 12, wherein the ground in said supplying a first current and supplying second current is a power ground.

14. The method of claim 12, wherein, in said supplying the first current, current flows through the first transistor with matching ratio (M) times as large as the current through the second transistor.

15. The method of claim 12, wherein in said comparing the sense voltage, the comparator amplifies a difference between the sense voltage and the reference voltage and outputs the amplified difference to the logic circuit.

16. The method of claim 13, wherein each connection through the power ground includes substantially the same parasitic resistance.

* * * * *